(12) United States Patent
Na et al.

(10) Patent No.: US 8,542,058 B2
(45) Date of Patent: Sep. 24, 2013

(54) SEMICONDUCTOR DEVICE INCLUDING BODY CONNECTED FETS

(75) Inventors: Myung-Hee Na, Lagrangeville, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 12/983,352

(22) Filed: Jan. 3, 2011

(65) Prior Publication Data

US 2012/0169415 A1 Jul. 5, 2012

(51) Int. Cl.
*H03K 17/687* (2006.01)
*G05F 1/10* (2006.01)

(52) U.S. Cl.
USPC .............................. 327/534; 327/427; 327/434

(58) Field of Classification Search
None
See application file for complete search history.

(56) References Cited

U.S. PATENT DOCUMENTS

| | | | | |
|---|---|---|---|---|
| 5,099,146 A | * | 3/1992 | Miki et al. ..................... | 327/77 |
| 6,037,808 A | * | 3/2000 | Houston et al. ................. | 327/55 |
| 6,529,421 B1 | * | 3/2003 | Marr et al. ............... | 365/189.09 |
| 7,215,147 B1 | * | 5/2007 | Segervall ......................... | 326/83 |
| 7,355,902 B2 | | 4/2008 | Bhushan et al. | |
| 7,994,842 B2 | * | 8/2011 | Ito ................................... | 327/534 |
| 7,999,603 B2 | * | 8/2011 | Sumita et al. .................. | 327/534 |
| 7,999,607 B2 | * | 8/2011 | Kuhn et al. ..................... | 327/544 |
| 8,081,099 B2 | * | 12/2011 | Ikoma et al. ................... | 341/144 |
| 2005/0230758 A1 | * | 10/2005 | LeReverend ................... | 257/368 |
| 2007/0114630 A1 | | 5/2007 | Kishima | |
| 2008/0143423 A1 | * | 6/2008 | Komatsu et al. .............. | 327/534 |

OTHER PUBLICATIONS

Matloubian, "Smart Body Contact for SOI MOSFETs", KnowledgeGate from IBM Market Insights, IEEE Xplore, Jun. 29, 2010, pp. 128-129.
Oh et al., "The effect of body contact arrangement on thin SOI MOSFET characteristics", Microelectronic Engineering 28, 1995, 367-470, pp. 467-470.

* cited by examiner

*Primary Examiner* — Lincoln Donovan
*Assistant Examiner* — Terry L Englund
(74) *Attorney, Agent, or Firm* — Richard M. Kotulak; Hoffman Warnick LLC

(57) ABSTRACT

A semiconductor device includes: a first field-effect transistor (FET); and a second FET of similar polarity to the first FET, wherein a body of the first FET is electrically coupled to a body of the second FET, and a source of the first FET is electrically coupled to a source of the second FET, such that a body voltage of the second FET controls a body voltage of the first FET.

1 Claim, 6 Drawing Sheets

SEMICONDUCTOR DEVICE INCLUDING BODY CONNECTED FETS

TECHNICAL FIELD

Embodiments of this disclosure relate generally to semiconductor devices and, more particularly, to a semiconductor device including body connected field-effect transistors (FETs).

BACKGROUND

The effective current in a field-effect transistor (FET) is an important parameter to measure for accurate performance benchmarking in partially depleted silicon-on-insulator (SOI) technology. When measuring this parameter of a FET, the FET must be switched from an off-state to an on-state. However, when switching the FET, the time for the body of the FET to reach a steady-state condition is more than the time it takes to switch on the FET, and hence during high-speed operation, the body charge remains nearly fixed at its starting value. When measuring devices, however, the time needed for accurate readings of standard instrumentation is large, compared to the characteristic time for the body to charge to steady state. Very specialized high-speed test equipment with specialized probe stations have been developed that include a fast sampling speed, but these devices are not consistently accurate and are extremely expensive for use in manufacturing.

BRIEF SUMMARY

A first aspect of the disclosure provides a semiconductor device comprising: a first field-effect transistor (FET); and a second FET of similar polarity to the first FET, wherein a body of the first FET is electrically coupled to a body of the second FET, and a source of the first FET is electrically coupled to a source of the second FET, such that a body voltage of the second FET controls a body voltage of the first FET.

A second aspect of the disclosure provides a semiconductor device comprising: a first field-effect transistor (FET); and a plurality of FETs connected in parallel, each of the plurality of FETs of similar polarity to the first FET, wherein a body of the first FET is electrically coupled to a body of each of the plurality of FETs, and a source of the first FET is electrically coupled to a source of each of the plurality of FETs, such that a body voltage of the plurality of FETs controls a body voltage of the first FET.

A third aspect of the disclosure provides a method of testing a field-effect transistor (FET), the method comprising: providing a first field-effect transistor (FET) and a second FET, wherein the first FET and the second FET include similar polarities, and wherein a body of the first FET is electrically coupled to a body of the second FET, and a source of the first FET is electrically coupled to a source of the second FET, such that a body voltage of the second FET controls a body voltage of the first FET; measuring a first drain current in a drain of the first FET; measuring a second drain current in the drain of the first FET; determining an effective current for the first FET based on an average of the first drain current and the second drain current.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

Figure 1:
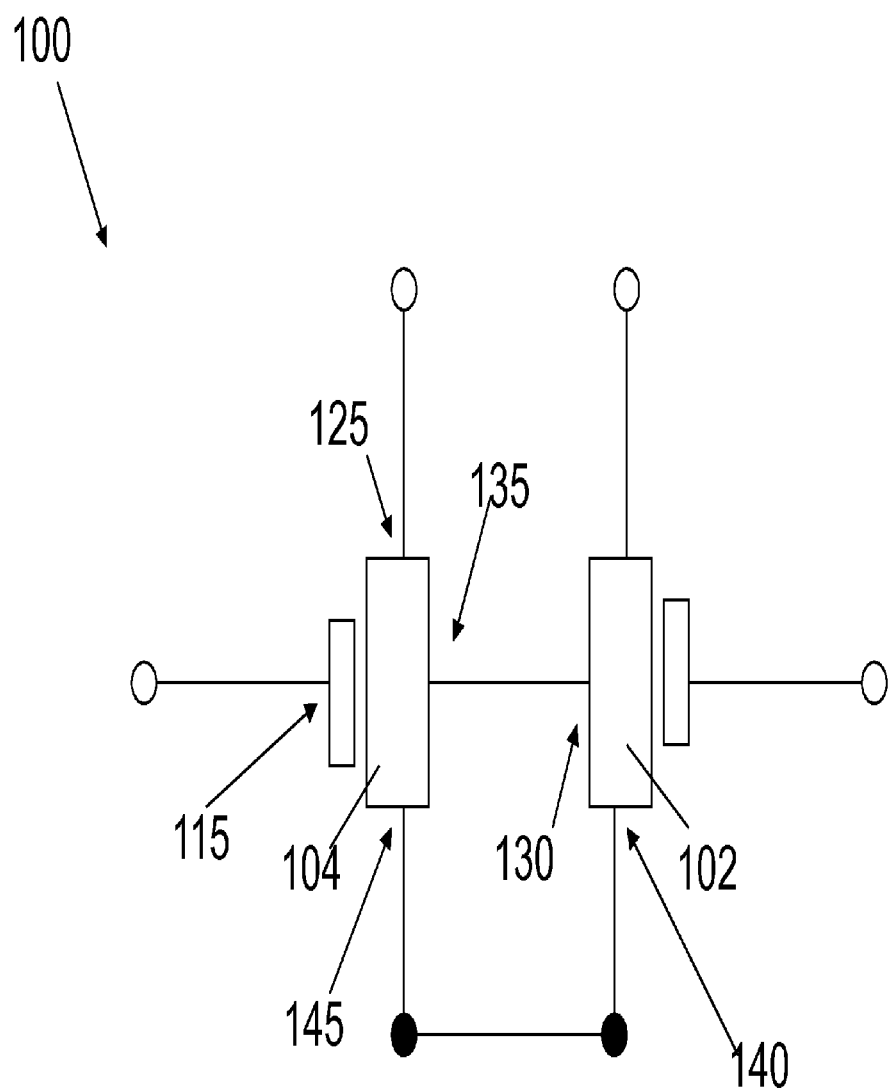
FIG. 1 shows a schematic illustration of a semiconductor device according to an embodiment of the invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

As seen in FIG. 1, an embodiment of a semiconductor device 100 according to an embodiment of the invention is shown. Semiconductor device 100 may include a first field-effect transistor (FET) 102 and a second FET 104. First FET 102 and second FET 104 may include similar polarities. That is, first FET 102 and second FET 104 may be n-type or first FET 102 and second FET 104 may be p-type. A body 130 of first FET 102 is electrically coupled to a body 135 of second FET 104 and a source 140 of first FET 102 is electrically coupled to a source 145 of second FET 104. These connections are configured such that a body voltage of second FET 104 controls a body voltage of first FET 102 and parameters, such as the effective drain current, of first FET 102 may be measured.

In the embodiment shown in FIG. 1, any desired voltage may be applied to a gate 115 of second FET 104 and drain 125 of second FET 104 in order to achieve a specified body voltage for second FET 104. Since body 135 of second FET 104 is electrically coupled to body 130 of first FET 102, the body voltage of first FET 102 will be the same as the body voltage of second FET 104.

Figure 2:
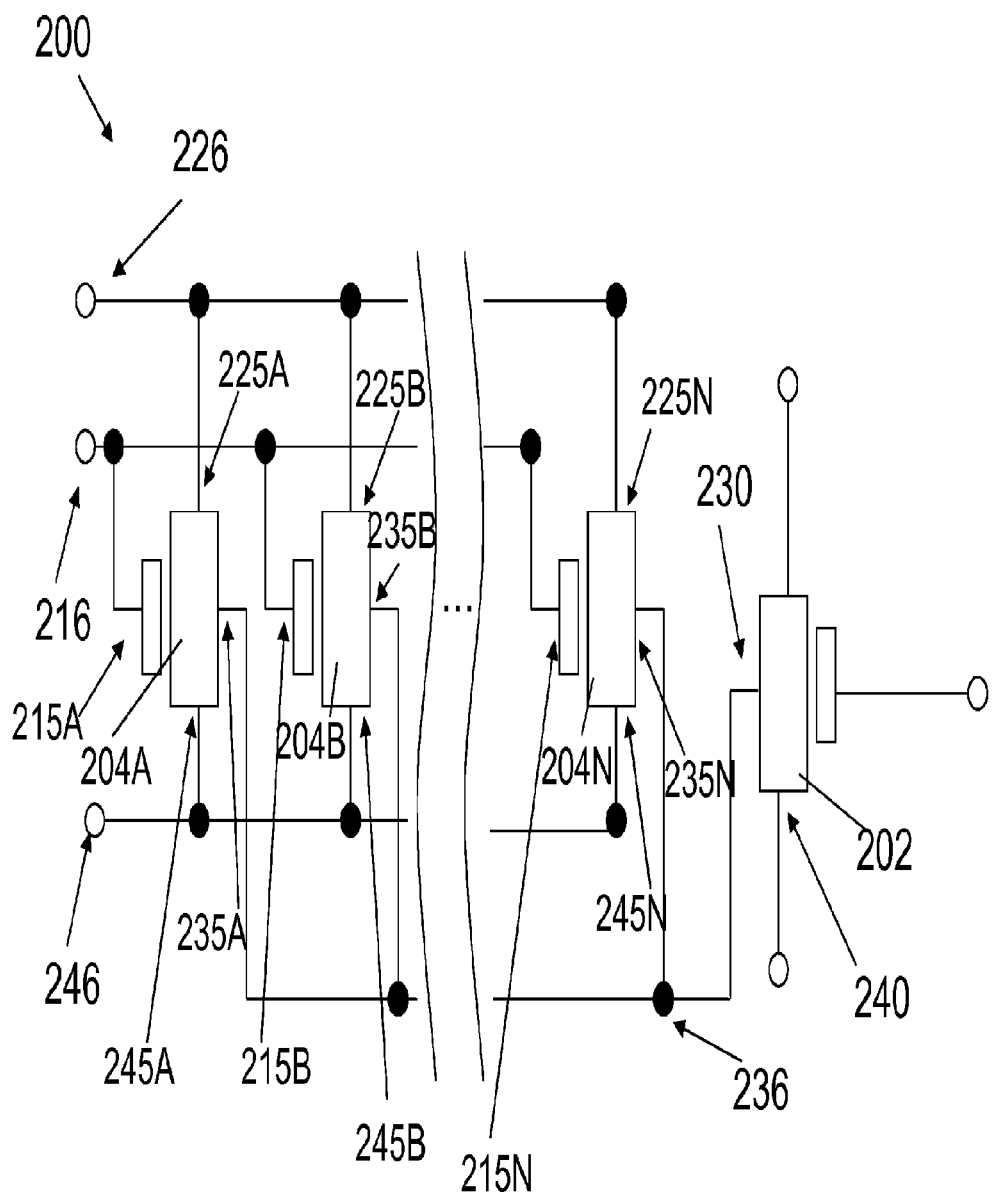
FIG. 2 shows a schematic illustration of a semiconductor device according to an embodiment of the invention.

Although the embodiment shown in FIG. 1 only includes first FET 102 and second FET 104, it is understood that multiple copies of second FET 104 may be required to control the body voltage of first FET 102. As seen in FIG. 2, a semiconductor device 200 according to an embodiment of the invention is shown. Semiconductor device 200 is similar to semiconductor device 100 shown in FIG. 1, however, semiconductor device 200 is shown including a plurality of FETs 204A, 204B, . . . , 204N connected in parallel. That is, drains 225A, 225B, . . . , 225N of each of plurality of FETs 204A, 204B, . . . , 204N are connected via connection 226, gates 215A, 215B, . . . , 215N of each of plurality of FETs 204A, 204B, . . . , 204N are connected via connection 216, and sources 245A, 245B, . . . , 245N of each of plurality of FETs 204A, 204B, . . . , 204N are connected via connection 246. Plurality of FETs 204A, 204B, . . . , 204N are connected in series with first FET 202. Bodies 235A, 235B, . . . , 235N of each of plurality of FETs 204A, 204B, . . . , 204N are also connected via connection 236 and connected to body 230 of first FET 202. Although not shown, sources 245A, 245B, . . . , 245N of each of plurality of FETs 204A, 204B, . . . , 204N may be connected to source 240 of first FET 202. Each FET of plurality of FETs 204A, 204B, . . . , 204N may be the same polarity as first FET 202. Plurality of FETs 204A, 204B, . . . , 204N may be n-type. Alternatively, plurality of FETs 204A, 204B, . . . , 204N may be p-type.

The number (N) of plurality of FETs 204A, 204B, . . . , 204N required to control the body voltage of first FET 202 will depend on certain parameters of first FET 202. For example, the effective impedance of the connected bodies 235 of the plurality of FETs 204A, 204B, . . . , 204N, which may be viewed as a voltage source, must be much greater than (e.g., at least approximately ten times more) the impedance of the body 230 of first FET 202.

Figure 3:
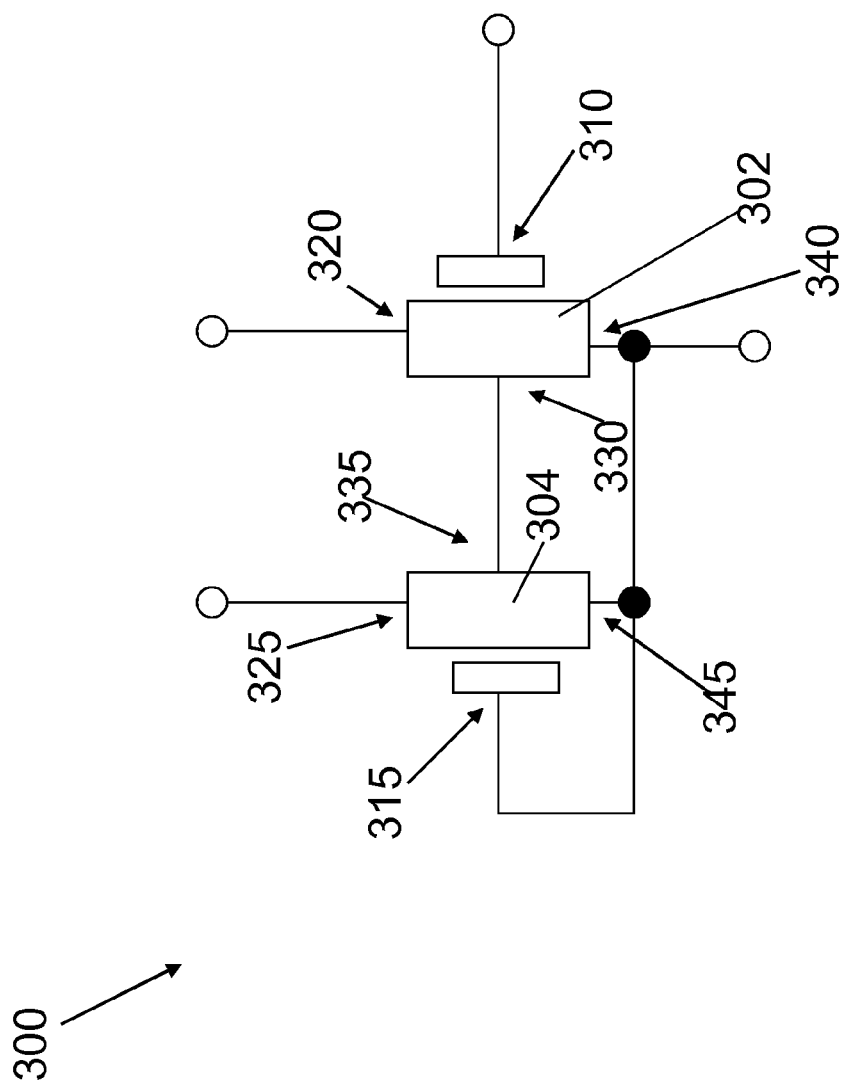
FIG. 3 shows a schematic illustration of a semiconductor device according to an embodiment of the invention.

Turning now to FIG. 3, a schematic illustration of a semiconductor device 300 according to an embodiment of the invention is shown. Semiconductor device 300 is similar to semiconductor device 100. However, a gate 315 of second FET 304 and source 345 of second FET 304 are electrically coupled to a source 340 of first FET 302. In this embodiment, when a drain 325 of second FET 304 is electrically connected to a power supply voltage (e.g., Vdd), the body voltage of second FET 304 is in the off-condition. This will control the body voltage of first FET 302 to be in the off-condition, since body 335 of second FET 304 is electrically coupled to body 330 of first FET 302. It is in this off-condition, that the effective current of first FET 302, the device under testing, may be determined.

Figure 4:
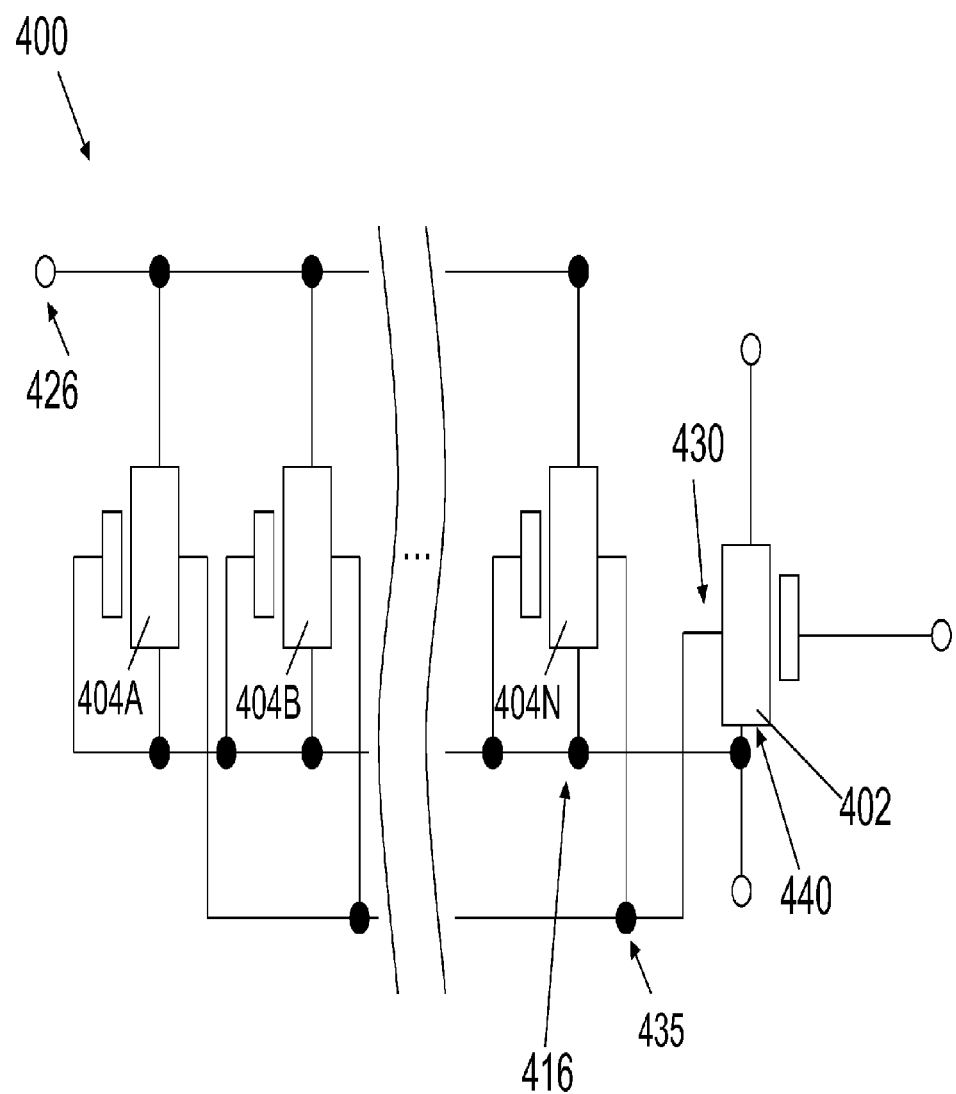
FIG. 4 shows a schematic illustration of a semiconductor device according to an embodiment of the invention.

Turning now to FIG. 4, a schematic illustration of a semiconductor device 400 according to an embodiment of the invention is shown. Semiconductor device 400 is similar to semiconductor device 300. However, semiconductor device 400 is shown including a plurality of FETs 404A, 404B, . . . , 404N connected in parallel. Plurality of FETs 404A, 404B, . . . , 404N is connected in series with first FET 402. Similar to semiconductor device 200 shown in FIG. 2, drains of each of plurality of FETs 404A, 404B, . . . , 404N are connected via connection 426, gates of each of plurality of FETs 404A, 404B, . . . , 404N are connected via connection 416, and sources of each of plurality of FETs 404A, 404B, . . . , 404N are connected via connection 416. Further, bodies of each of plurality of FETs 404A, 404B, . . . , 404N are connected via connection 436 and connected to body 430 of first FET 402. Also, gates and sources of each of plurality of FETs 404A, 404B, . . . , 404N are connected via connection 416 to source 440 of first FET 402. Each FET of plurality of FETs 404A, 404B, . . . , 404N are the same polarity as first FET 402.

As mentioned above with other embodiments, the number (N) of plurality of FETs 404A, 404B, . . . , 404N required to control the body voltage of first FET 402 will Depend on certain parameters of first FET 402. For example, the effective impedance of the connected bodies 435 of the plurality of FETs 404A, 404B, . . . , 404N, which may be viewed as a voltage source, must be much greater than (e.g., at least approximately ten times more) the impedance of the body 430 of first FET 402.

Figure 5:
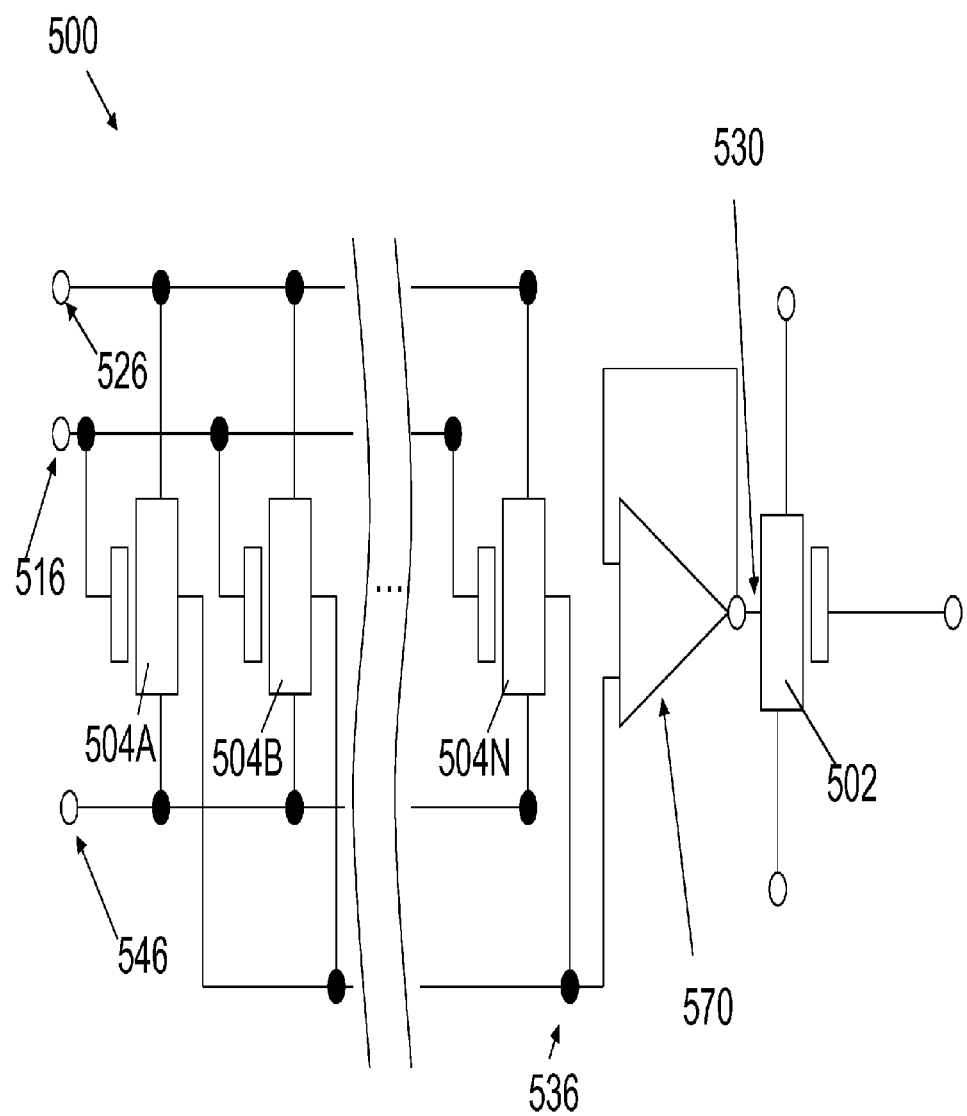
FIG. 5 shows a schematic illustration of a semiconductor device according to an embodiment of the invention.

Turning now to FIG. 5, a schematic illustration of a semiconductor device 500 according to an embodiment of the invention is shown. In this embodiment, semiconductor device 500 includes an operational amplifier 570. As shown, semiconductor device 500 includes features similar to those features discussed above with respect to semiconductor device 200 in FIG. 2. That is, drains of each of plurality of FETs 504A, 504B, . . . , 504N are connected via connection 526, gates of each of plurality of FETs 504A, 504B, . . . , 504N are connected via connection 516, and sources of each of plurality of FETs 504A, 504B, . . . , 504N are connected via connection 546. Further, bodies of each of plurality of FETs 504A, 504B, . . . , 504N are connected via connection 536. Although operational amplifier 570 is applied to semiconductor device 200 in FIG. 2, it is understood that operational amplifier 570 may be similarly applied to all embodiments discussed herein.

Operational amplifier 570 may electrically connect bodies of each of plurality of FETs 504A, 504B, . . . , 504N via connection 536 to body 530 of first FET 502. Operational amplifier 570 will reduce the effective impedance of the voltage source provided by the body voltage of bodies 535 of plurality of FETs 504A, 504B, . . . , 504N in order to reduce the number (N) of FETs 504A, 504B, . . . , 504N that are required to control the body voltage of first FET 502. It is understood that operational amplifier 570 is only an example of a device that may be used to reduce the effective impedance of the voltage source provided by the body voltage of bodies 535.

Figure 6:
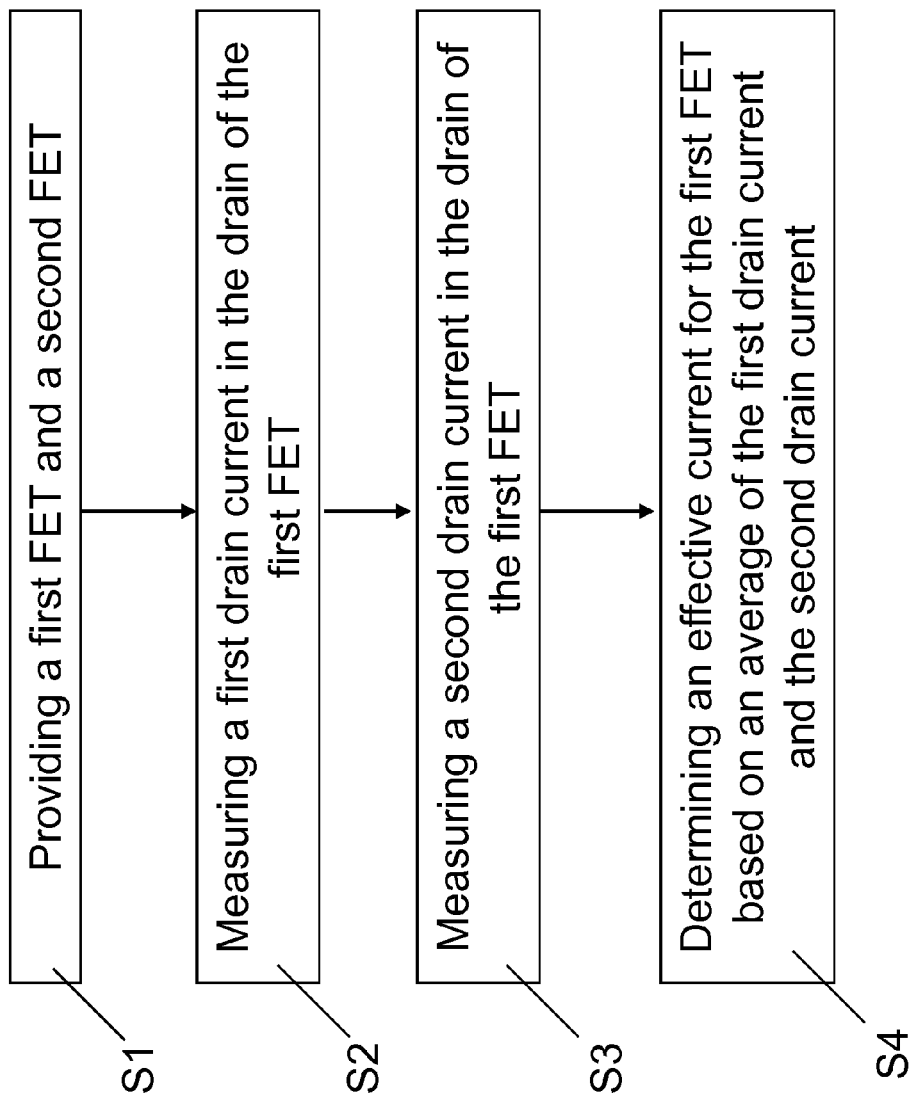
FIG. 6 shows a flow diagram of a method of testing a field-effect transistor (FET) within a semiconductor device according to an embodiment of the invention.

Turning not to FIG. 6, the method of testing first FET 302 will now be discussed with respect to the semiconductor device 300 as seen in FIG. 3. However, it is understood that this method may be similarly applied to all embodiments discussed herein.

First, in step S1, semiconductor device 300 including first FET 302 and second FET 304 may be provided. As mentioned above, first FET 302 and second FET 304 may include similar polarities. That is, first FET 302 and second FET 304 may be n-type. Alternatively, first FET 302 and second FET 304 may be p-type. Body 335 of second FET 304 is electrically coupled to body 330 of first FET 302. Further, gate 315 and source 345 of second FET 304 may be electrically coupled to source 340 of first FET 302.

Next, in step S2, a first drain current in drain 320 of first FET 302 may be measured and, in step S3, a second drain current in drain 320 of first FET 302 may be measured.

In order to measure first drain current in drain 320, a first voltage is applied to drain 320 of first FET 302 and drain 325 of second FET 304. Further, a second voltage is applied to gate 310 of first FET 302. The second voltage may be approximately half of the first voltage. For example, the first voltage may be the power supply voltage (Vdd) and the second voltage may be half the power supply voltage (Vdd/2). In this condition, the body voltage of first FET 302 is controlled by the body voltage of second FET 304 to be in the off-condition. It is in this off-condition that an accurate measurement of the effective current for first FET 302 is obtained.

In order to measure second drain current in drain 320 of first FET 302, a third voltage is applied to drain 320 of first FET 302 and gate 310 of first FET 302. Further, a fourth voltage is applied to drain 325 of second FET 304. The fourth voltage may be approximately half of the third voltage. For example, the third voltage may be the power supply voltage (Vdd) and the fourth voltage may be half the power supply voltage (Vdd/2). In this condition, the body voltage of first FET 302 is still controlled by the body voltage of second FET 304 to be in the off-condition.

Next, in step S4, the effective current for first FET 302 may be determined. The effective current for first FET 302 is based on the first drain current and the second drain current. The effective current for first FET 302 is determined by calculating the average of the first drain current and the second drain current.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device comprising:
   a first field-effect transistor (FET);
   a plurality of FETs connected in parallel, each of the plurality of FETs is of similar polarity to the first FET, wherein a body of each of the plurality of FETs is electrically coupled to each other along a first connection, each gate of the plurality of FETs is electrically coupled to each other along a second connection, each source of the plurality of FETs is electrically coupled to each other along a third connection, each drain of the plurality of FETs is electrically coupled to each other along a fourth connection, the first connection, the second connection, the third connection and the fourth connection are separate and distinct from each other; and
   an operational amplifier electrically connecting the body of each of the plurality of FETs to the body of the first FET, the operational amplifier including a first input, a second input and an output connected to the body of the first FET, the first input coupled to the body of each of the plurality of FETs along the first connection and the second input coupled to the output.

* * * * *